(12) United States Patent
Yamashita et al.

(10) Patent No.: US 8,968,488 B2
(45) Date of Patent: Mar. 3, 2015

(54) CREAM SOLDER AND METHOD OF SOLDERING ELECTRONIC PART

(75) Inventors: Mitsuo Yamashita, Hino (JP); Tomoaki Goto, Tokyo (JP); Takeshi Asagi, Tokyo (JP)

(73) Assignees: Fuji Electric Co., Ltd., Kawasaki-Shi (JP); Nihon Handa Co., Ltd., Tokyo (JP)

( * ) Notice: Subject to any disclaimer, the term of this patent is extended or adjusted under 35 U.S.C. 154(b) by 589 days.

(21) Appl. No.: 12/307,370

(22) PCT Filed: Jul. 3, 2007

(86) PCT No.: PCT/JP2007/063267
§ 371 (c)(1),
(2), (4) Date: Oct. 14, 2011

(87) PCT Pub. No.: WO2008/004531
PCT Pub. Date: Jan. 10, 2008

(65) Prior Publication Data
US 2012/0018048 A1 Jan. 26, 2012

(30) Foreign Application Priority Data

| Jul. 5, 2006 | (JP) | 2006-185080 |
| Jul. 12, 2006 | (JP) | 2006-191707 |
| Oct. 10, 2006 | (JP) | 2006-276819 |
| Oct. 10, 2006 | (JP) | 2006-276820 |

(51) Int. Cl.
*B23K 35/34* (2006.01)

(52) U.S. Cl.
USPC .................. 148/24; 420/560; 75/255

(58) Field of Classification Search
USPC ................. 420/560; 148/24; 75/255

IPC ... H01L 2924/00,2924/0105, 2924/0133; B23K 35/262, 35/025
See application file for complete search history.

(56) References Cited

U.S. PATENT DOCUMENTS

| 6,231,691 B1 | 5/2001 | Anderson et al. |
| 2004/0177997 A1 | 9/2004 | Hata et al. |
| 2005/0100474 A1* | 5/2005 | Huang et al. ........... 420/560 |

FOREIGN PATENT DOCUMENTS

| EP | 1 724 050 | 11/2006 |
| JP | 1-177366 | 7/1989 |

(Continued)

OTHER PUBLICATIONS

International Search Report of Jan. 8, 2008, p. 1.
(Continued)

*Primary Examiner* — Weiping Zhu
(74) *Attorney, Agent, or Firm* — Young & Thompson

(57) ABSTRACT

A cream solder obtained by kneading an Sn—Ag—Cu alloy together with a flux, wherein the Sn—Ag—Cu alloy includes a mixture of a first powdery alloy and a second powdery alloy, the first powdery alloy is represented by an Sn—Ag phase diagram having a solid-liquid coexistence region and has a given silver amount which is larger than that in the eutectic composition (3.5 wt. % silver), and the second powdery alloy has a silver amount which is that in the eutectic composition (3.5 wt. % silver) or which is close to that in the eutectic composition and is smaller than that in the first powdery alloy. This cream solder has excellent strength and thermal stability, and satisfactory bonding properties. It is based on an inexpensive Sn—Ag—Cu solder alloy. It is suitable for use as a high-temperature-side lead-free solder material conformable to temperature gradation bonding. Also provided is a method of soldering.

8 Claims, 9 Drawing Sheets

(56) References Cited

FOREIGN PATENT DOCUMENTS

| | | |
|---|---|---|
| JP | 1-271094 | 10/1989 |
| JP | 10-266987 | 10/1998 |
| JP | 11-138292 | 5/1999 |
| JP | 11/186712 | 7/1999 |
| JP | 2001-504760 | 4/2001 |
| JP | 1-266987 | 9/2001 |
| JP | 2001-266987 | 9/2001 |
| JP | 2002-126893 | 5/2002 |
| JP | 2002126893 A * | 5/2002 |
| JP | 2002-254195 | 9/2002 |
| JP | 2002-280396 | 9/2002 |
| JP | 2002-314241 | 10/2002 |
| JP | 2003-260587 | 9/2003 |
| JP | 2004-130371 | 4/2004 |
| JP | 3558083 | 5/2004 |
| JP | 3558063 | 8/2004 |
| JP | 2007-268569 | 10/2007 |
| WO | 2005/084877 | 9/2005 |

OTHER PUBLICATIONS

Extended European Search Report (pp. 3-4); Application No. 13170700.2.

* cited by examiner (b) X-ray image of Sn (d) X-ray image of Cu (a) Backscattered electron image (c) X-ray image of Ag

Fig.3

Results of Heat Resistance Tests

Alloy  SACN:Sn20Ag5Cu0.1Ni,  SACNG:Sn3.5Ag0.5Cu0.07Ni0.01Ge,  SAC:Sn3.0Ag0.5Cu

| | Alloy | Heat resistance [°C] | | | | | | | Molten alloy composition [wt%] | | | |
|---|---|---|---|---|---|---|---|---|---|---|---|---|
| | | 220 | 230 | 240 | 250 | 260 | 270 | 280 | Sn | Ag | Cu | Ni |
| (Comparative Example) | SAC | O | O | × | × | × | × | × | 96.5 | 3.0 | 0.5 | 0 |
| (Example 3) | SACN:SACNG = 1:3 | O | O | × | × | × | × | × | 90.8 | 7.6 | 1.6 | 0.08 |
| (Example 2) | SACN:SACNG = 1:1 | O | O | O | O | O | × | × | 85.4 | 11.8 | 2.8 | 0.09 |
| (Example 1) | SACN:SACNG = 3:1 | O | O | O | O | O | O | O | 80.2 | 15.9 | 3.9 | 0.09 |

Fig.5

| Composition | Values as Measured | | | | | | | Average (GPa) |
|---|---|---|---|---|---|---|---|---|
| Comparative Example  Sn20%Ag5%Cu0.1%Ni: Sn3.5%Ag0.5%Cu0.07%Ni0.01%Ge=3:1 | 0.46 | 0.60 | 0.51 | 0.51 | 0.49 | 0.58 | 0.57 | 0.55 | 0.54 |
| Example  Sn20%Ag5%Cu0.1%Ni: (Sn3.5%Ag0.5%Cu0.07%Ni0.01%Ge+7.4%Sb)=3:1 | 0.79 | 0.57 | 0.58 | 0.65 | 0.75 | 0.78 | 0.65 | 0.59 | 0.64 |

Fig.9

| Composition | Values as Measured | | | | | | | Average (GPa) |
|---|---|---|---|---|---|---|---|---|
| Comparative Example Sn20%Ag5%Cu0.1%Ni: Sn3.5%Ag0.5%Cu0.07%Ni0.01%Ge=3:1 | 0.46 | 0.60 | 0.51 | 0.51 | 0.49 | 0.58 | 0.57 | 0.55 | 0.54 |
| Example 1 Sn20%Ag5%Cu0.1%Ni: (Sn3.5%Ag0.5%Cu0.07%Ni0.01%Ge+7.75%In)=3:1 | 1.02 | 0.96 | 1.22 | 1.08 | 0.93 | 1.02 | 0.86 | 1.01 | 1.01 |
| Example 2 Sn20%Ag5%Cu0.1%Ni: (Sn3.5%Ag0.5%Cu0.07%Ni0.01%Ge+8.4%Bi)=3:1 | 0.73 | 0.56 | 0.66 | 0.74 | 0.53 | 0.54 | 0.55 | 0.67 | 0.62 |

CREAM SOLDER AND METHOD OF SOLDERING ELECTRONIC PART

TECHNICAL FIELD

The present invention relates to a solder cream used for soldering electronic parts, particularly a solder cream formed from a solder alloy for the high-temperature side of dual-temperature solder connection which is a lead-free solder alloy not containing lead, and a method of soldering electronic parts.

BACKGROUND ART

The reflow process is usually employed for soldering an electronic part to a printed circuit board, or the like. The reflow process is a process for soldering an electronic part to a printed circuit board by applying a solder cream to an area of the printed circuit board to which the electronic part is to be soldered, mounting the electronic part so that its electrode and planar lead may engage the applied area, and heating the printed circuit board in a ref low oven to melt the solder cream.

The solder cream used in the ref low process is a viscous solder material obtained by kneading a solder alloy powder and a flux paste. The solder alloy powder which has usually been employed for a solder cream has been of an Sn—Pb eutectic alloy.

This solder alloy containing lead has been restricted in use as lead pollutes the environment and enterprises have been actively trying to put the so-called "lead-free solder" into practical use. The solder used for a solder cream is also being replaced by a "lead-free solder". A typical lead-free solder material is an SnAg solder material (eutectic containing 3.5% Ag) and it has a melting point of about 220° C.

The Japan Electronics and Information Technology Industries Association (JEITA) published a road map for putting a lead-free solder into practical use in November, 2001 based on data accumulated by enterprises entrusted by NEDO from their research and development project for the practical use of a lead-free solder, and recommended therein Sn-3.0Ag-0.5Cu as the preferred composition of an SnAgCu material. Such being the case, many of the SnAgCu lead-free solders currently available in Japan are of the Sn-3.0Ag-0.5Cu composition.

A wide variety of patent applications relating to lead-free solders have been filed by various companies (see, for example, Patent Documents 1 to 3).

Patent Document 1 relates to an SnAgCu lead-free solder containing Sn-3.0Ag-0.5Cu and discloses the following. According to the Abstract in Patent Document 1, it aims at "providing a lead-free solder paste not forming any void in a soldered portion for a package part even by soldering at the reflow temperature not higher than 250° C. at which no thermal damage occurs to an electronic part or printed circuit board during the soldering of a surface-mounted part, not causing any chip standing of a chip part, and excellent in printing property." As a solution, it discloses that "two or more kinds of solder alloy powders different in composition or the proportions of its components are mixed and melted so that the two or more kinds of solder alloy powders composed of 0-8 mass % Ag, 0-5 mass % Cu and 80-100 mass % Sn may produce a solder paste containing 1-5 mass % Ag and 0.5-3 mass % Cu with a balance consisting of Sn."

Patent Document 2 aims at "improving an Sn—Ag alloy and providing an Sn—Ag solder alloy having excellent strength, thermal stability and good bonding property". As a solution, it discloses that "it contains tin as its main constituent and further contains 1.0 to 4.0% by weight of silver, not more than 2.0% by weight of copper, not more than 1.0% by weight of nickel and not more than 0.2% by weight of phosphorus. It may alternatively contain tin as its main constituent and further contain 1.0 to 4.0% by weight of silver, not more than 2.0% by weight of copper, not more than 1.0% by weight of nickel and not more than 0.1% by weight of germanium. Cu forms a solid solution in Sn and improves the strength and heat resistance of the alloy without impairing its wetting property. Ni raises the thermal stability of the alloy because of its high melting point. Adding Ni also forms a fine crystal structure or forms an Ni—Sn compound and thereby yields an alloy of improved strength and thermal fatigue property. Adding P and Ge forms a thin oxide film upon melting of the solder and thereby suppress the oxidation of solder components such as Sn."

Patent Document 3 aims at "modifying an Sn—Ag—Cu eutectic alloy with a small amount of one or more low-cost alloy additives to enhance the high temperature stability of its microstructure and its thermal-mechanical fatigue strength without decreasing solderability". As a solution, it discloses that "an appropriate fourth or fifth elemental additive in a total amount not exceeding about 1% by weight is added to an Sn—Ag—Cu ternary eutectic solder alloy consisting mainly of Sn, 4.7% Ag and 1.7% Cu (wt. %), while a modifier of the intermetallic interface between the solder and substrate is selected from the group consisting of Ni, Fe and other elements acting like Ni or Fe, to improve the high temperature stability and the thermal-mechanical fatigue strength of the microstructure of a solder joint."

The soldering of an electronic part to a printed circuit board, or the like by the reflow process is often carried out by a method employing at least two kinds of solders having different reflow temperatures and conducting two steps of soldering on the high- and low-temperature sides, respectively, i.e. the so-called dual-temperature solder connection. For example, a semi-conductor chip is joined to the board by a high-temperature step, while wiring connections to the printed circuit board are made by a low-temperature step, so that it may be possible to prevent the joint of the semiconductor chip to the board from melting and failing to maintain its joining, or from even its separation.

In the case of lead-containing solders, a lead-rich high-temperature solder (having a melting point of 275° C. to 302° C.) is, for example, used for the high-temperature step, and a lead-tin eutectic solder (having a melting point of 183° C.) for the low-temperature step. In the event that a lead-free solder, for example, an Sn—Ag solder alloy, is used for the low-temperature step of dual-temperature solder connection, a suitable substitute for the lead-containing high-temperature solder is required as a solder material for the high-temperature step.

Although an Au—Sn alloy (having a eutectic melting point of 280° C.) is available as a high-temperature lead-free solder material which can be used for dual-temperature solder connection, it is expensive and there is no practical solder material that can be used widely. A silver brazing material is available as a metallic joining material, but requires a joining temperature which is as high as 800° C. to 900° C. It is known that silver nano-particles have activated surfaces and require only a joining temperature of 250° C. to 300° C. However, silver nano-particles are usually coated with an organic material and mixed with an organic solvent prior to their use to avoid the oxidation of their surfaces. They form a joint having problems of voids and an organic residue. The voids and organic residue lower the thermal conductivity, electrical conductivity and thermal fatigue reliability of the joint which are important for an electronic appliance. Therefore, they undesirably require a reducing atmosphere for the organic material, the application of a load, etc. to be capable of functioning as a joining material.

Patent Document 4 discloses an invention of an electronic appliance for which a special solder paste is used as a high-temperature lead-free solder.

Patent Document 4 aims at "providing an electronic device made by an entirely novel solder connection, and more specifically, realizing a flip-chip connection for the high-temperature step of dual-temperature solder connection as a substitute for a high-Pb solder containing a large amount of Pb". As a solution, it discloses "an electronic device characterized in that joints between the electrodes of electronic parts and the electrodes of a substrate are formed by connecting metal balls containing a simple metal, alloy, compound or a mixture thereof with either Sn or In", and "an electronic device characterized in that joints between the electrodes of electronic parts and the electrodes of a substrate are formed by supplying the clearances between the electrodes with a paste obtained by mixing metal balls containing a simple metal, alloy, compound or a mixture thereof with one or more of an Sn—Cu solder, an Sn—Ag solder, an Sn—Ag—Cu solder and a solder prepared by adding one or more of In, Zn and Bi thereto, and heating them to melt components of the solder balls to join the metal balls to each other and also between the electrodes of the electronic parts and the electrodes of the substrate".

Patent Document 1: Publication JP-A-2002-126893
Patent Document 2: Publication JP-A-11-77366
Patent Document 3: Publication JP-T-2001-504760
Patent Document 4: Publication JP-A-2002-314241

SUMMARY OF THE INVENTION

The present invention has been made under the above circumstances, and aims as an object thereof at providing a high-temperature lead-free solder material which is based on an inexpensive Sn—Ag—Cu solder alloy having high strength and thermal stability and good bonding property, and is suitable for application to dual-temperature solder connection, and a method of soldering an electronic part.

The present invention also aims as another object thereof at providing a high-temperature lead-free solder material which can form a solder joint of improved heat resistance and reliability, and is suitable for application to dual-temperature solder connection, and a method of soldering an electronic part.

The above objects are attained by the following.

A solder cream obtained by kneading an Sn—Ag—Cu alloy with a flux, is characterized in that the Sn—Ag—Cu alloy comprises a mixture of a first powder alloy and a second powder alloy, the first powder alloy having a solid and liquid coexisting region on an Sn—Ag phase diagram and containing a larger amount of Ag than that in their eutectic composition (containing 3.5% by weight of Ag), while the second powder alloy is or is close to a eutectic composition (containing 3.5% by weight of Ag), and contains a smaller amount of Ag than the first powder alloy does.

A solder cream obtained by kneading an Sn—Ag—Cu alloy with a flux, is characterized in that the Sn—Ag—Cu alloy comprises a mixture of a first powder alloy containing 10 to 30% by weight of Ag and 2 to 20% by weight of Cu with a balance consisting of Sn and unavoidable impurities, and a second powder alloy containing smaller compositions (% by weight) of Ag and Cu than the first powder alloy, and having a melting point lower than that of the first powder alloy, the mixture containing a total of not more than 30% by weight of Ag and Cu.

A specific form of a solder cream is characterized in that the second powder alloy contains not more than 4.0% (and more than 0%) by weight of Ag and not more than 2.0% (and more than 0%) by weight of Cu with a balance consisting of Sn and unavoidable impurities.

A more specific form of a solder cream is characterized in that the first powder alloy occupies not less than 50% by weight of the mixture of the first and second powder alloys.

A solder cream obtained by kneading an Sn—Ag—Cu alloy with a flux, is characterized in that the Sn—Ag—Cu alloy comprises a mixture of a first powder alloy containing 10 to 30% by weight of Ag and 2 to 20% by weight of Cu with a balance consisting of Sn and unavoidable impurities, and a second powder alloy containing not more than 4.0% (and more than 0%) by weight of Ag, not more than 2.0% (and more than 0%) by weight of Cu and one of not more than 8% (and more than 0%) by weight of Sb, not more than 10% (and more than 0%) by weight of In and not more than 10% (and more than 0%) by weight of Bi, with a balance consisting of Sn and unavoidable impurities, the mixture containing a total of not more than 35% by weight of Ag and Cu.

A solder cream obtained by kneading an Sn—Ag—Cu alloy with a flux, is characterized in that the Sn—Ag—Cu alloy comprises an alloy mixture of a first powder alloy containing 10 to 30% by weight of Ag and 2 to 20% by weight of Cu with a balance consisting of Sn and unavoidable impurities and a second powder alloy containing not more than 4.0% (and more than 0%) by weight of Ag and not more than 2.0% (and more than 0%) by weight of Cu with a balance consisting of Sn and unavoidable impurities, and a Cu powder added to the alloy mixture as a third powder, the alloy mixture containing a total of not more than 35% by weight of Ag and Cu, the Cu powder occupying not more than 25% by weight of the total weight of the alloy mixture and the Cu powder.

A more specific form of a solder cream is characterized in that the first and/or second powder alloy contains at least one of elements Ni, Fe, Co and Ge added thereto in the amount of not more than 1.0% by weight in the case of Ni, Fe or Co, and in the amount of not more than 0.1% by weight in the case of Ge.

A method of soldering an electronic part, characterized by using a solder cream.

A method of soldering an electronic part by two steps of high- and low-temperature soldering in a reflow process employing at least two kinds of solders having different reflow temperatures, is characterized in that high-temperature soldering as the former step is carried out by employing a solder cream obtained by kneading an Sn—Ag—Cu alloy with a flux, wherein the Sn—Ag—Cu alloy comprises a mixture of a first powder alloy and a second powder alloy, the first powder alloy having a solid and liquid coexisting region on an Sn—Ag phase diagram and containing a larger amount of Ag than that in their eutectic composition (containing 3.5% by weight of Ag), while the second powder alloy is or is close to a eutectic composition (containing 3.5% by weight of Ag), and contains a smaller amount of Ag than the first powder alloy does, and whereafter low-temperature soldering as the latter step is carried out by employing a solder cream obtained by kneading the second powder solder with a flux.

A method of soldering an electronic part by two steps of high- and low-temperature soldering in a reflow process employing at least two kinds of solders having different reflow temperatures, is characterized in that high-temperature soldering as the former step is carried out by employing a solder cream obtained by kneading an Sn—Ag—Cu alloy with a flux, wherein the Sn—Ag—Cu alloy comprises a mixture of a first powder alloy containing 10 to 30% by weight of Ag and 2 to 20% by weight of Cu with a balance consisting of Sn and unavoidable impurities, and a second powder alloy containing smaller proportions (% by weight) of Ag and Cu than the first powder alloy, and having a melting point lower than that of the first powder alloy, the mixture containing a total of not more than 30% by weight of Ag and Cu, and whereafter low-temperature soldering as the latter step is carried out by employing a solder cream obtained by kneading the second powder solder with a flux.

A specific form of a method of soldering an electronic part is characterized in that the second powder alloy contains not more than 4.0% (and more than 0%) by weight of Ag and not more than 2.0% (and more than 0%) by weight of Cu with a balance consisting of Sn and unavoidable impurities.

A more specific form of a method of soldering an electronic part is characterized in that the first powder alloy occupies not less than 50% by weight of the mixture of the first and second powder alloys.

A more specific form of a method of soldering an electronic part is characterized in that the low-temperature soldering as the latter step employs a reflow temperature corresponding to the solid and liquid coexisting region of the first powder alloy.

A method of soldering an electronic part by two steps of high- and low-temperature soldering in a reflow process employing at least two kinds of solders having different reflow temperatures, is characterized in that high-temperature soldering as the former step is carried out by employing a solder cream obtained by kneading an Sn—Ag—Cu alloy with a flux, wherein the Sn—Ag—Cu alloy comprises a mixture of a first powder alloy containing 10 to 30% by weight of Ag and 2 to 20% by weight of Cu with a balance consisting of Sn and unavoidable impurities, and a second powder alloy containing not more than 4.0% (and more than 0%) by weight of Ag, not more than 2.0% (and more than 0%) by weight of Cu and one of not more than 8% (and more than 0%) by weight of Sb, not more than 10% (and more than 0%) by weight of In and not more than 10% (and more than 0%) by weight of Bi, with a balance consisting of Sn and unavoidable impurities, the mixture containing a total of not more than 35% by weight of Ag and Cu, and whereafter low-temperature soldering as the latter step is carried out by employing a solder cream obtained by kneading the second powder solder with a flux.

A method of soldering an electronic part by two steps of high- and low-temperature soldering in a reflow process employing at least two kinds of solders having different reflow temperatures, is characterized in that high-temperature soldering as the former step is carried out by employing a solder cream obtained by kneading an Sn—Ag—Cu alloy with a flux, wherein the Sn—Ag—Cu alloy comprises a mixture of a first powder alloy containing 10 to 30% by weight of Ag and 2 to 20% by weight of Cu with a balance consisting of Sn and unavoidable impurities and a second powder alloy containing not more than 4.0% (and more than 0%) by weight of Ag and not more than 2.0% (and more than 0%) by weight of Cu with a balance consisting of Sn and unavoidable impurities, and a mixture of the alloy mixture with a Cu powder as a third powder, the alloy mixture containing a total of not more than 35% by weight of Ag and Cu, the Cu powder occupying not more than 25% by weight of the total weight of the alloy mixture and the Cu powder, and whereafter low-temperature soldering as the latter step is carried out by employing a solder cream obtained by kneading the second powder solder with a flux.

A more specific form of a method of soldering an electronic part is characterized in that the first and/or second powder alloy contains at least one of elements Ni, Fe, Co and Ge added thereto in the amount of not more than 1.0% by weight in the case of Ni, Fe or Co, and in the amount of not more than 0.1% by weight in the case of Ge.

BRIEF DESCRIPTION OF THE DRAWINGS

FIG. 3 is a table showing the compositions of the alloys according to Examples of the first invention and a Comparative Example and the results of their evaluation for heat resistance.

FIG. 5 is a table showing the compositions of the alloys according to an Example of the second invention and a Comparative Example and the results of measurements on the hardness of their Sn-based matrixes.

FIG. 9 is a table showing the compositions of the alloys according to Examples of the fourth invention and a Comparative Example and the results of measurements on the hardness of their Sn-based matrix.

BEST MODE OF CARRYING OUT THE INVENTION

First Invention

Description will now be made of a specific form of the first invention with reference to the Sn—Ag phase diagram shown as FIG. 1. Specific examples of the solder cream according to the first invention, the results of their evaluation, etc. will be described later in the section of Examples.

The following description employs a simplified expression of a composition for convenience of explanation. For example, 3.5 wt % Ag is indicated as 3.5% Ag or Ag3.5%, or more simply as 3.5Ag.

Figure 1:
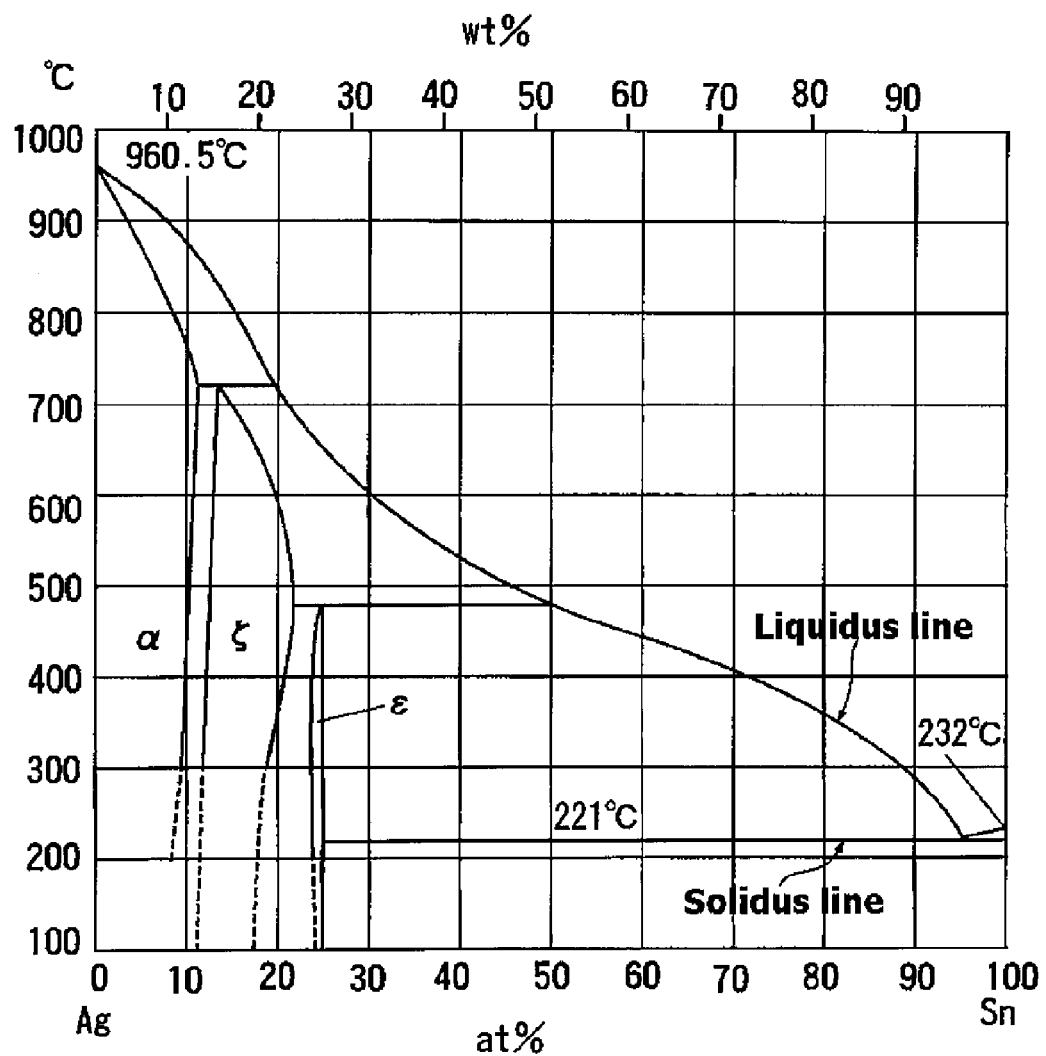
FIG. 1 is an Sn—Ag phase diagram explaining a specific form of a first invention.

Reference is first made to the Sn—Ag phase diagram in FIG. 1. In FIG. 1, the vertical axis shows temperatures, degree centigrade (° C.) and the horizontal axis shows the proportion of Sn in atomic % (at %) at bottom and in weight % (wt %) at top. In the phase diagram in FIG. 1, the liquidus line is a line showing the temperature at which a solid phase begins to crystallize from a complete liquid on congelation, or at which a solid turns into a complete liquid on heating. The solidus line is a line at which a liquid solidifies into a complete solid on congelation, or at which a liquid phase beings to be formed from a complete solid on heating.

On the Sn—Ag phase diagram, the eutectic composition contains 3.5 wt % Ag and maintains a eutectic reaction until it contains about 70 wt % of Ag (the solidus indicates a eutectic temperature of 221° C.), and the liquidus temperature at which a solid is completely liquefied rises with an increase in the amount of Ag. While liquefaction starts along the solidus line on heating, an increase in the amount of Ag facilitates the coexistence of the solid and liquid phases in a wide temperature range not lower than the solidus. Therefore, the use of a solder cream comprising a mixture of a first and a second powder alloy according to claim 1 as a high-temperature solder enables the first powder alloy to maintain a joint in the state in which the solid and liquid phases coexist, when the working temperature for the latter step of the reflow process (the ref low temperature of the low-temperature solder) is from 250° C. to 260° C. Therefore, there is obtained an accurate high-temperature solder joint which is so viscous that its separation and movement are suppressed during the low-temperature soldering operation.

The addition of Cu to an Sn—Ag alloy gives an Sn—Ag alloy having characteristics of an excellent joining material in jointing property and reliability, since it not only suppresses the elution of Cu from the material to be joined, but is also effective for achieving an adequate improvement in the strength of a solder joint. This Sn—Ag alloy is improved in heat resistance if it contains a large amount of Cu than an alloy close to an Sn—Ag—Cu ternary eutectic composition (typically Sn3.5Ag0.5Cu).

If an alloy containing more than 3.5% of Ag is melted and solidified into e.g. a sheet, and when it contains, for example, 20% Ag, $Sn_3Ag$ begins to crystallize at a liquidus temperature close to 360° C., and as its primary crystal becomes coarser with lowering of temperature, its use as a solder material raises doubt in reliability, since a coarse crystal is likely to exist in a microstructure.

According to the first invention, therefore, a solder material is prepared and used for joining in a powder form. A solder material composed of fine particles undergoes uniform liquefaction easily at or above the solidus and thereby makes joining easier at a relatively low temperature, since the components of the particles have a narrow density distribution and are diffused easily. While the solder alloy may be in the form of a powder having a particle size of 20 to 50 μm which is usually employed for a solder cream, still finer particles are effective for the first invention, since the diffusion and melting of the particles according to the first invention are promoted.

While the increase in the amounts of Ag and Cu gives a heat-resistant solder material which precipitates an AgSn compound and a CuSn compound dispersed in a microstructure on joining and solidifying as described above, it is feared that a solder cream containing a flux may form voids due to insufficient removal of gases, depending on the state of the materials to be joined. In any such event, the fluidity of the solder material on joining is desired.

According to the first invention, a solder material of the composition containing large amounts of Ag and Cu as stated above and forming a wide solid and liquid coexisting region is employed as a first powder alloy, while a solder material of good fluidity having a low Ag content, typically a powder of the composition close to an Sn—Ag eutectic composition (having a melting point of 221° C.), is used as a second powder alloy, and a mixture of those alloy powders is kneaded with a flux to produce a solder cream.

More specifically, the solder cream is prepared by kneading with a flux a mixture of a first powder alloy containing 10-30 wt % Ag and 2-20 wt % Cu with a balance consisting of Sn and unavoidable impurities, and a second powder alloy containing smaller proportions (% by weight) of Ag and Cu than the first powder alloy, and having a melting point lower than that of the first powder alloy. However, the addition of large amounts of Ag and Cu brings about an increase in the total amount of AgSn and CuSn compounds. A total amount not exceeding 35% is desirable for Ag and Cu, since an excess of AgSn and CuSn compounds results in a highly viscous solder which is likely form a joint having voids.

The amount of Ag alone has a lower limit of 10% at which the solder has a satisfactory actual working temperature range of 250° C. to 300° C. in its semi-molten state against a solidus of 221° C. as a liquidus/solidus temperature range for forming a joint in its semi-molten state, and an upper limit of 30% (a liquidus of about 410° C.) in view of its viscosity in its semi-molten state. The amount of Cu alone has a lower limit of 2% to facilitate the formation of a CuSn compound in the joint and an upper limit of 20% in view of the fact that any excess of Cu results in CuSn of high strength imparting brittleness as a predominant property.

In the solder cream described above, the first and/or second powder alloy preferably contains at least one of elements Ni, Fe, Co and Ge added thereto in the amount of not more than a 1.0 wt % in the case of Ni, Fe or Co, and in the amount of not more, than 0.1 wt % in the case of Ge. Ni improves thermal stability and bonding property, Fe and Co improve thermal stability, strength and reliability, and Ge contributes to inhibiting the oxidation of Sn. The addition of Ni, Fe, Co or Ge is desirable for the second to fourth inventions, too.

The first powder alloy preferably occupies not less than 50% by weight of the mixture of the first and second powder alloys. This improves the heat resistance of the solder material and makes it still more suitable as a high-temperature solder, as will be discussed in detail.

A known flux can be employed. For example, it is possible to use a flux obtained by placing 50 parts of polymerized rosin, 46 parts of butyl carbitol, 0.5 part of cyclohexylamine hydrobromide, 0.5 part of adipic acid and 3 parts of hydrogenated castor oil, and dissolving them under heat. These fluxes can be used with the second to fourth inventions, too.

When two steps of high- and low-temperature soldering are carried out in a reflow process employing at least two kinds of solders having different reflow temperatures, the high-temperature soldering as the former step is carried out by employing a solder cream obtained by kneading a mixture of the first and second powder alloys with a flux at a reflow temperature of, for example, 280° C. to 300° C., and thereafter the low-temperature soldering as the latter step is carried out by employing a solder cream obtained by kneading the second powder alloy with a flux at a reflow temperature of, for example, 250° C. to 260° C.

It, therefore, follows that during the latter step of heating at 250° C. to 260° C., the high-temperature solder is in the solid and liquid coexisting state and is so viscous as to hold together the materials to be joined and maintain a joint without the separation of any material. The high-temperature solder is in the state in which a semi-molten first powder alloy and a completely molten second powder alloy are mixed and diffused with each other, and the adequate selection of the composition of the first powder alloy to meet any requirement yields any desired composition formed by the first and second powder alloys mixed together.

Two steps of high- and low-temperature soldering carried out in a reflow process employing at least two kinds of solders having different reflow temperatures are applicable to the second to fourth inventions, too.

Examples of the First Invention

Examples of the first invention and the results of their evaluation will now be described with a comparative example.

Figure 2:
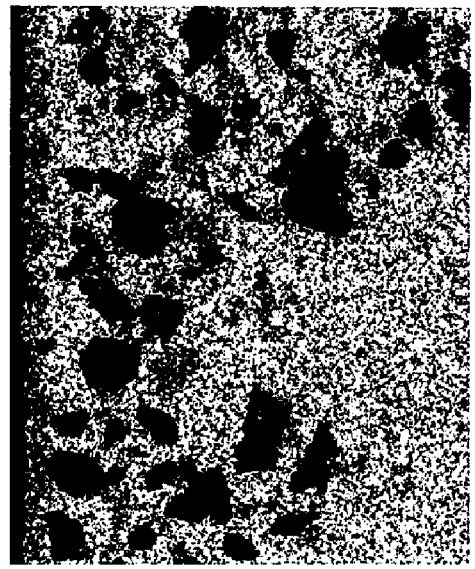
FIG. 2 is a view showing the sectional structures and metal distributions, as examined through a microscope, of a solder joint according to an Example of the first invention.
Figure 2:
Figure 2:
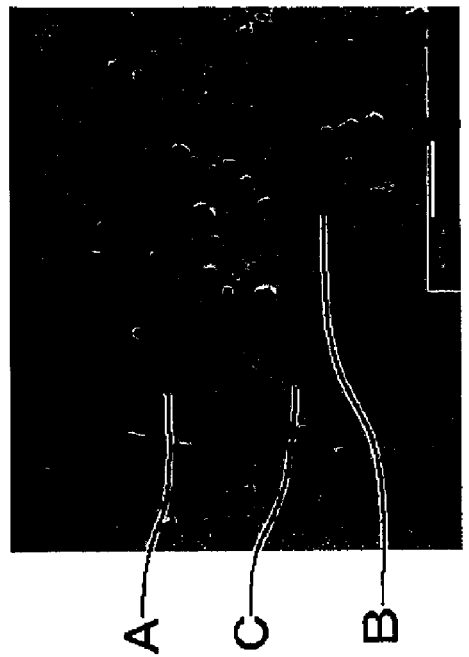
Figure 2:
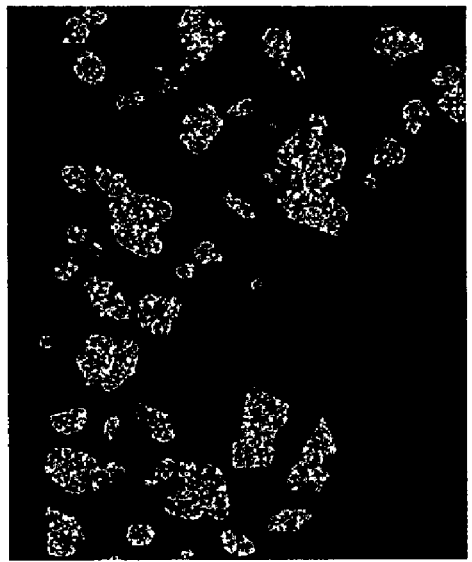

FIG. 2 is a view showing the sectional structures and metal distributions as examined through a microscope of a solder joint according to Example 1 of the first invention, and FIG. 3 shows the compositions of the alloys according to Examples 1 to 3 of the first invention and Comparative Example and the results of their evaluation for heat resistance.

Description will first be made of a solder cream according to Example 1. The solder cream was prepared by mixing in a weight ratio of 3:1 a powder obtained by melting at about 400° C. an Sn20Ag5Cu0.1Ni alloy made by melting at 530° C., and having a particle diameter of 20 to 45 μm (with a solidus of about 220° C. and a liquidus of about 350° C.), and an Sn3.5Ag0.5Cu0.07Ni0.01Ge powder (having a particle diameter of 20 to 45 μm and a melting point of about 220° C.), and mixing their mixture with a flux. The addition of Ni is effective for improving heat resistance and bonding property and for forming fine particles by a precipitate of NiSn, and the addition of Ge is effective for inhibiting the oxidation of the main constituent Sn and improving bonding property and storage stability of the solder cream.

FIG. 2 shows the sectional structures and metal distributions of a joint made by heating the solder cream to about 250° C. to join copper sheets, as analyzed by energy dispersive X-ray spectroscopy (EDX), and the state in which precipitates are dispersed. FIG. 2(a) shows a backscattered electron image, and FIGS. 2(b) (c) and (d) show the distributions of Sn, Ag and Cu, respectively, by X-ray images. In FIG. 2, the precipitates are mainly an AgSn compound ($Ag_3Sn$) and a CuSn compound ($Cu_6Sn_5$), with a base in which Sn was predominant, while Ag and Cu were slightly detected.

In the backscattered electron image of FIG. 2(a), relatively black dispersed precipitates A are $Cu_6Sn_5$, dispersed precipitates B having a somewhat lighter gray color than $Cu_6Sn_5$ are $Ag_3Sn$, and fine precipitates C in the grain boundary are an AgSn compound other than $Ag_3Sn$, the rest being an Sn—Ag—Cu alloy. The relatively black dispersed parts of FIG. 2(b) show the distribution of Sn, the relatively white dispersed parts of FIG. 2(c) show the distribution of Ag and the relatively white dispersed parts of FIG. 2(d) show the distribution of Cu.

When an Sn20% Ag5% Cu0.1% Ni alloy is melted and solidified into a bulk, it is usually the case that SnAg begins to precipitate as a primary crystal at a liquidus of about 360° C. and becomes coarser with a drop in temperature, while a CuSn precipitate forms a microstructure consisting mainly of coarse AgSn and CuSn precipitates. A solder joint having a dispersed structure as stated above has the same characteristics as a dispersion-strengthened composite material, and is uniform and stable in quality and excellent in reliability.

Description will now be made of FIG. 3 showing the compositions of the alloys according to Examples 1 to 3 and Comparative Example and the results of their evaluation for heat resistance. In FIG. 3, the Sn20Ag5Cu0.1Ni alloy according to Example 1 is shown by a symbol SACN, and the Sn3.5Ag0.5Cu0.07Ni0.01Ge alloy by a symbol SACNG. The ratio of the alloys SACN:SACNG is 3:1 in Example 1 as stated before, and 1:1 and 1:3 in Examples 2 and 3, respectively. The alloy according to Comparative Example is shown by a symbol SAC and is Sn3.0Ag0.5Cu (as recommended by JEITA).

FIG. 3 show the results of evaluation of Examples 1 to and Comparative Example for heat resistance and the compositions of the alloys as melted. Their evaluation for heat resistance [° C.] was carried out as explained below. A solder cream was applied onto the surface of a Cu plate to form a layer measuring 4 mm by 4 mm by 0.3 mm and a Cu block (measuring 5 mm by 5 mm by 5 mm) was joined thereto by 30 seconds of heating at 260° C. Then, a heat resistance test was conducted by placing the joint in an upright position and heating it in the range of 220° C. to 280° C. The result is shown as x when the copper block dropped by its own weight, and as ○ when it did not. These results confirm the superiority of the Examples of the first invention in heat resistance to Comparative Example (known material Sn3.0Ag0.5Cu), and the experiment confirms that heat resistance is definitely improved when the amount of Ag in the molten alloy is over about 10%, as in Examples 1 and 2. The total amount of Ag having a lower limit of 10% ensures the realization of a semi-molten state, facilitates the precipitation of the AgSn compound and improves heat resistance. The amount of Ag in the molten alloy over about 10% is realized approximately when in FIG. 3, the first powder alloy (SACN) occupies not less than 50% by weight of the mixture of the first powder alloy (SACN) and the second powder alloy (SACNG).

It is obvious from the results shown in FIG. 3 that if in the case of two steps of soldering at a high temperature and at a low temperature, respectively, by the reflow process, the former step of high-temperature soldering is carried out by employing a solder cream prepared by kneading the alloy of Example 1 or 2 with a flux and at a reflow temperature of, for example, 280° C. to 300° C., and whereafter the latter step of low-temperature soldering is carried out by employing a solder cream prepared by kneading the alloy of Comparative Example with a flux and at a reflow temperature of, for example, 250° C. to 260° C., the high-temperature solder is in a solid and liquid coexisting state during the latter step of heating at 250° C. to 260° C., and is so viscous as to suppress any mutual movement of the materials forming a joint and maintain the joint without any separation thereof.

Second Invention

Description will now be made of the second invention. Specific examples of the solder cream according to the second invention, the results of their evaluation, etc. will be described later in the section of Examples.

The second invention is characterized by "comprising a mixture of a first powder alloy containing 10-30 wt % Ag and 2-20 wt % Cu with a balance consisting of Sn and unavoidable impurities, and a second powder alloy containing not more than 4.0 wt % Ag, not more than 2.0 wt % Cu and not more than 6 wt % Sb with a balance consisting of Sn and unavoidable impurities, the mixture containing a total of not more than 35 wt % of Ag and Cu". The technical meanings of all the constituents except Sb in the second powder alloy have been stated in detail in the description of the first invention. The meanings of the constituents of the first powder alloy characterized mainly by containing more Ag and Cu than any standard solder alloy of the eutectic composition have also been stated in detail in the description of the first invention.

Explanation will now be made of the meaning of Sb added to the second powder alloy close to a eutectic composition.

While FIG. 2 relating to the first invention shows the sectional structures and metal distributions of a solder joint made without adding Sb, a strengthened Sn-based matrix is desirable for improving the heat resistance and reliability of the solder joint. The SnAgCu composition is encountered by the coarsening of crystal grains and the aggregation of Ag in its micro-structure, resulting in a reduction in strength of the Sn-based matrix, after a long time of use, depending on the temperature at which it is used. Therefore, Sb is added to the second powder alloy.

Figure 4:
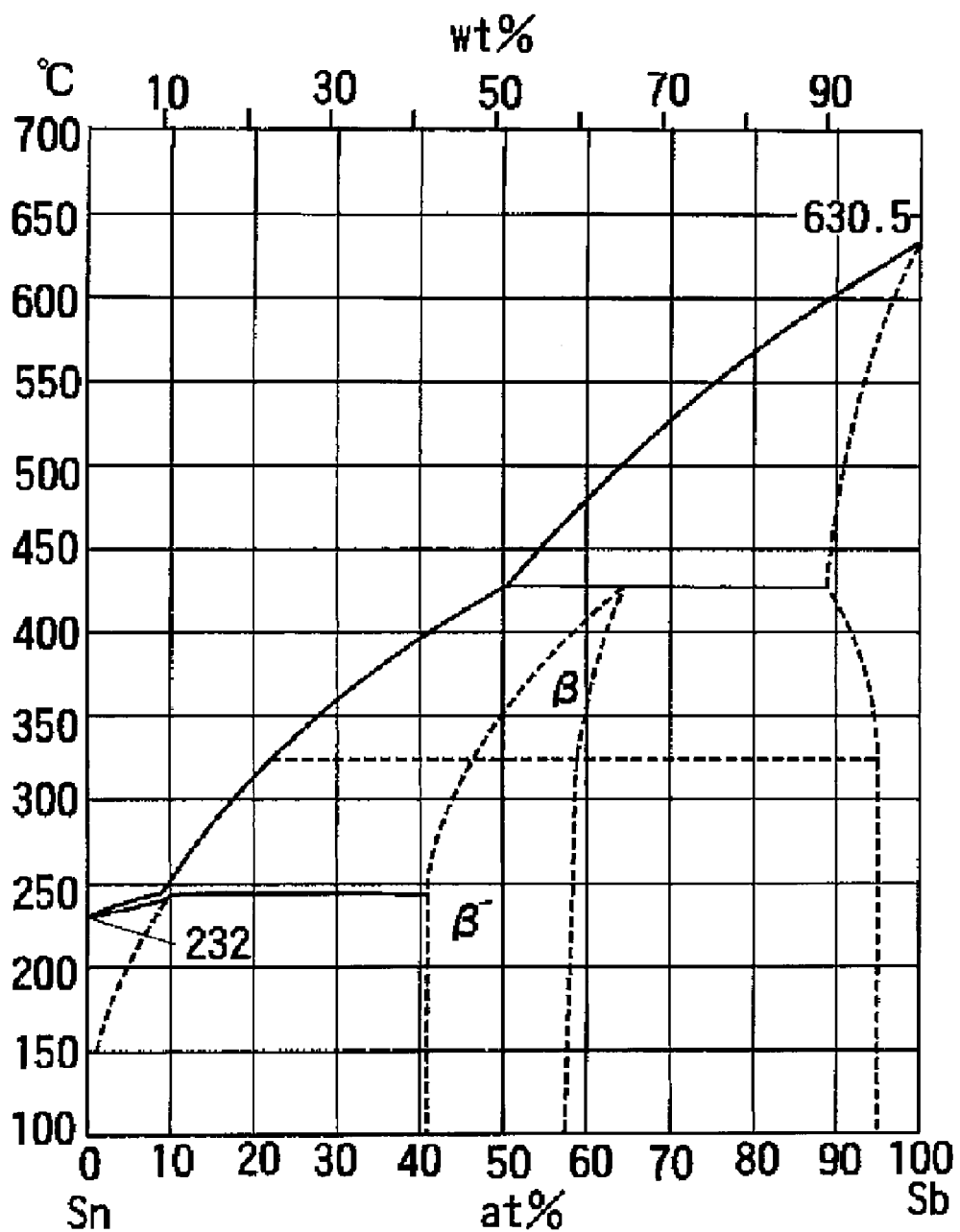
FIG. 4 is an Sn—Sb phase diagram explaining a specific form of a second invention.

FIG. 4 shows an Sn—Sb phase diagram. While Sb has a melting point of 630.5° C., the Sn—Sb phase diagram shows a peritectic phase and Sb forms a solid solution in Sn to form a fine SnSb precipitate having a high melting point (425° C.). It suppresses the diffusion of a solid solution constituent, such as Ag, and thereby raises the stability of the structure of a solder joint and improves its heat resistance and reliability.

Examples of the Second Invention

An example of the second invention and the results of its evaluation will now be described with a comparative example with reference to FIG. 5. FIG. 5 is a table showing the compositions of the alloys according to the Example of the second invention and the Comparative Example and the results of measurements on the hardness of their Sn-based matrixes.

Description will first be made of the composition of the solder cream according to Comparative Example to which no Sb was added, and the steps for preparing it. A powder having a particle diameter of 20 to 45 μm (with a solidus of about 220° C. and a liquidus of about 350° C.) was prepared as a first powder alloy by melting at about 400° C. an Sn20Ag5Cu0.1Ni alloy made by melting at 530° C. An Sn3.5Ag0.5Cu0.07Ni0.01Ge powder (having a particle diameter of 20 to 45 μm and a melting point of about 220° C.) was prepared as a second powder alloy. The first and second powder alloys were mixed in a weight ratio of 3:1 and their mixture was mixed with a flux to prepare a solder cream. This solder cream is identical to what has been described as Example 1 of the first invention.

Description will now be made of the composition of the solder cream according to Example in FIG. 5 and the steps for preparing it. The first powder alloy was identical to what was employed in Comparative Example as described above. A powder obtained by adding 7.4 wt Sb to the above Sn3.5Ag0.5Cu0.07Ni0.01Ge powder (having a particle diameter of 20 to 45 μm) was employed as the second powder alloy. The first and second powder alloys were mixed in a weight ratio of 3:1 and their mixture was mixed with a flux to prepare a solder cream. The mixture of the first and second powder alloys according to the present Example contained 2 wt % of Sb.

The addition of Ni is effective for improving heat resistance and bonding property and for forming fine particles by a precipitate of NiSn, and the addition of Ge is effective for inhibiting the oxidation of the main constituent Sn and improving bonding property and storage stability of the solder cream.

Description will now be made of the results of measurements of hardness of the Sn-based matrix of each of the solder joints according to Example and Comparative Example as described above. The hardness of the matrix was measured by the nano-indentation method. The measurements were made at eight points, and FIG. 5 shows the values as obtained at the eight points and the average thereof. The hardness was determined from an indentation pressure (GPa) based on a load-displacement curve obtained from an indentation test conducted by employing a triangular pyramid indenter and a weight of 0.5 mN. The larger the value, the higher the hardness of the matrix.

The Example in which Sb was added showed an improved hardness owing to the strengthened solid solution of Sb over the Comparative Example. Accordingly, the Example can be said to have higher thermal fatigue strength and improved heat resistance and reliability. The addition of Sb is preferably not more than 8 wt % so that no increase in viscosity may result from an elevation in liquidus of the Sn—Sb compound.

Third Invention

Description will now be made of a specific form of the third invention. Specific examples of the solder cream according to the third invention, the results of their evaluation, etc. will be described later in the section of Examples.

The third invention is characterized by "comprising an alloy mixture of a first powder alloy containing 10-30 wt % Ag and 2-20 wt % Cu with a balance consisting of Sn and unavoidable impurities and a second powder alloy containing not more than 4.0 wt % (and more than 0%) of Ag and not more than 2.0 wt % (and more than 0%) Cu with a balance consisting of Sn and unavoidable impurities, and a Cu powder added to the alloy mixture as a third powder, the alloy mixture containing a total of not more than 35 wt % of Ag and Cu, the Cu powder occupying not more than 25 wt % of the total weight of the alloy mixture and the Cu powder". The technical meanings of all the constituents in the alloy mixture have been stated in detail in the description of the first invention. The meanings of the constituents of the first powder alloy characterized mainly by containing more Ag and Cu than any standard solder alloy of the eutectic composition have also been stated in detail in the description of the first invention.

The meaning of "adding a Cu powder as a third powder" will now be explained.

While FIG. 2 relating to the first invention shows the sectional Structures and metal distributions of a solder joint made without adding a Cu powder as a third powder, a strengthened Sn-based matrix is desirable for improving the heat resistance and reliability of the solder joint.

As the first powder alloy has a high Ag content and the second powder alloy is a material close to a standard eutectic composition, their mixture gives a material which is more expensive than any known Pb—Sn solder. While the presence of a large amount of precipitate is desirable from a reliability standpoint and an increase in the amount of the first powder alloy is, therefore, desirable, it results in an Ag-rich material which is still more expensive. Therefore, a metal powder having a higher melting point than those of the first and second powder alloys, such as a Cu powder, is added as a third metal powder.

The Cu powder remains a solid and thereby lowers a liquid proportion even when a joint is formed at a temperature higher than the solidus temperatures of the first and second powder alloys, and lower than their liquidus temperatures, i.e. when they are in a semi-molten state. When the Sn-based matrix is solidified, a CuSn compound is formed between the Cu powder and the semi-molten Sn-based matrix, or a CuSnNi compound when Ni is present, contributing to strengthening the matrix. When a joint is formed at a temperature lower than the first liquidus line, the Cu powder as a high-melting third metal powder remains a solid, while the first and second powder alloys become semi-molten, and their mutual diffusion forms a microstructure composed of the Cu powder, CuSn precipitate, AgSn compound precipitate and a matrix close to SnAg eutectic composition when the joint has been formed. Therefore, a solder joint strengthened as a whole can be obtained.

According to the third invention, when two steps of high- and low-temperature soldering are carried out in a reflow process employing at least two kinds of solders having different reflow temperatures, the high-temperature soldering as the former step is carried out by employing a solder cream obtained by kneading a mixture of the first and second powder alloys and the Cu powder as the third powder with a flux at a reflow temperature of, for example, 280° C. to 300° C., and thereafter the low-temperature soldering as the latter step is carried out by employing a solder cream obtained by kneading the second powder alloy with a flux at a reflow temperature of, for example, 250° C. to 260° C.

Therefore, during the latter step of heating at 250° C. to 260° C., the high-temperature solder is in the solid and liquid coexisting state and is so viscous as to hold together the materials to be joined and maintain a joint without the separation of any material. The high-temperature solder is in the state in which a semi-molten first powder alloy and a completely molten second powder alloy are mixed and diffused with each other, and the adequate selection of the composition of the first powder alloy to meet any requirement yields any desired composition formed by the first and second powder alloys mixed together.

Examples of the Third Invention

Figure 6:
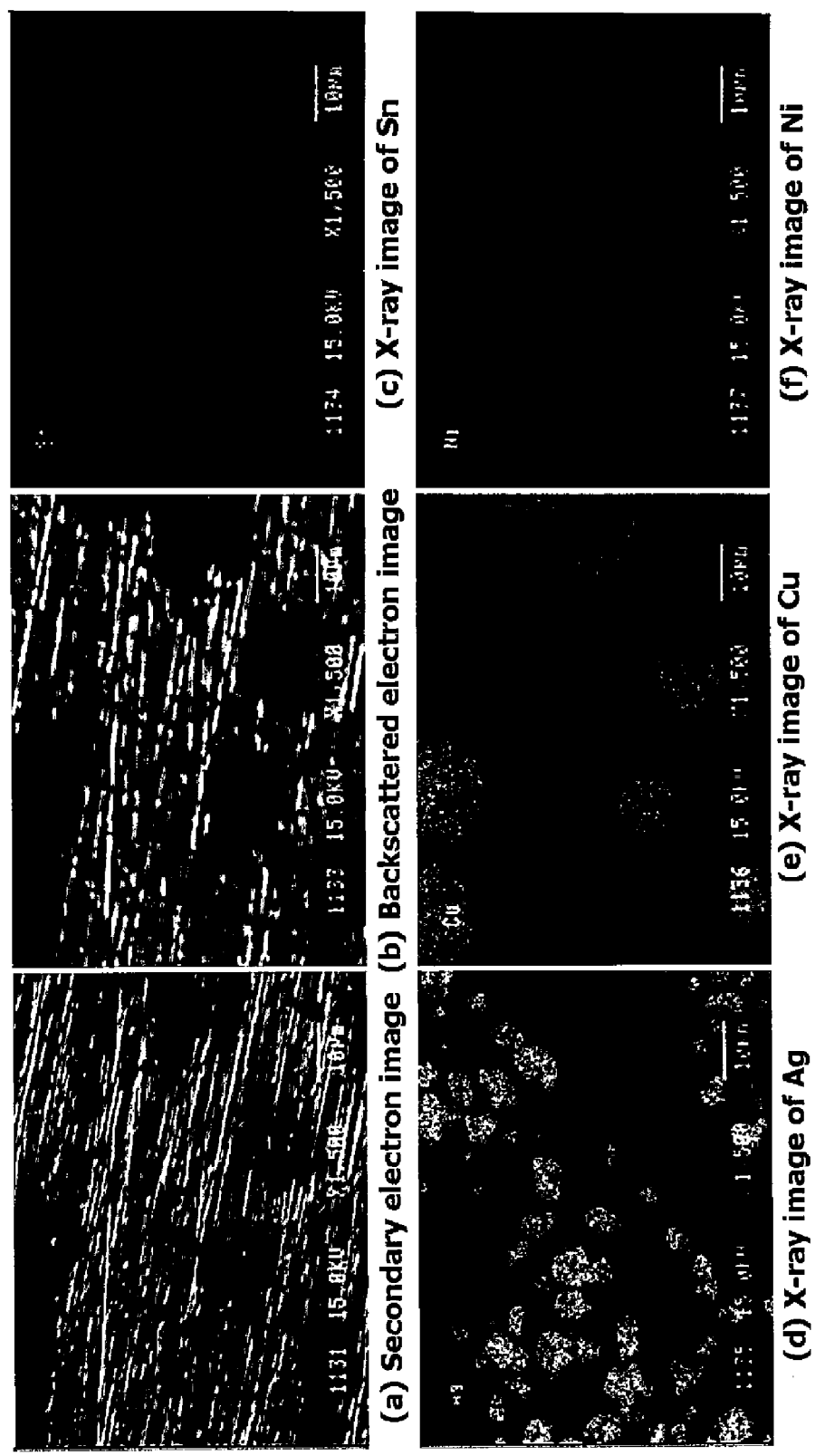
FIG. 6 is a view showing the sectional structures of a solder joint according to an Example of a third invention as examined through a microscope and analyzed by an X-ray microanalyzer.

An example of the third invention and the results of its evaluation will now be described with reference to FIG. 6. FIG. 6 is a view showing the sectional structures of a solder joint according to an Example of the third invention as examined through a microscope and analyzed by an X-ray microanalyzer.

Description will first be made of the composition of the solder cream and the steps for preparing it. A powder having a particle diameter of 20 to 45 μm (with a solidus of about 220° C. and a liquidus of about 350° C.) was prepared as a first powder alloy by melting at about 400° C. an Sn20Ag5Cu0.1Ni alloy made by melting at 530° C. An Sn3.5Ag0.5Cu0.07Ni0.01Ge powder (having a particle diameter of 20 to 45 μm and a melting point of about 220° C.) was prepared as a second powder alloy. The first and second powder alloys were mixed in a weight ratio of 3:1 and the alloy mixture was mixed with a Cu powder having a particle diameter of 45 μm and a flux to prepare a solder cream.

The evaluation of solder joints was made by varying the amount of the Cu powder. The results will now be described.

Five solder creams containing different amounts of Cu powder (10, 20, 30, 35 and 40 wt %, respectively, of the whole weight) were applied onto a copper sheet to form a layer having a thickness of 0.2 mm, melted by heating at 150° C. for 60 sec. and at 260° C. for 30 sec. on a heating plate, and cooled to solidify. Voids were visible in the solder containing 35 wt % or more Cu, and markedly in the solder containing 40 wt % Cu. No void was visible in any solder containing 20 wt % or less Cu. Thus, it is preferable for the Cu powder to occupy not more than 25 wt % of the total weight of the alloy mixture and the Cu powder.

In the Example described above, the addition of Ni is effective for improving heat resistance and bonding property and for forming fine particles by a precipitate of NiSn, and also for forming a ternary compound of Cu, Sn and Ni by the diffusion reaction of the Cu powder and the first and second powder alloys and formation of an intermetallic compound in the interface. The compound of Cu, Sn and Ni is easier to maintain in a stable state than a binary compound of Cu and Sn, since the diffusion between the Cu powder and the SnAg solder is suppressed after the compound is formed. The addition of Ge is effective for inhibiting the oxidation of the main constituent Sn and for improving the fluidity of the solder, its bonding property and in the case of the solder cream, its storage stability by suppressing the reaction between the solder metal powder and the flux.

Reference is now made to FIG. 6. FIG. 6 shows the sectional microstructure of a solder containing 20 wt % of Cu powder, melted by heating at 250° C. and cooled to solidify, and the distribution of its constituents as examined by an EPMA (X-ray microanalyzer).

In FIG. 6, (a) shows a secondary electron image, (b) a backscattered electron image, (c) an X-ray image of Sn, (d) an X-ray image of Ag, (e) an X-ray image of Cu, and (f) an X-ray image of Ni. Relatively large white balls in (e) correspond to black balls in (a) and (b), and show remaining solid dispersions of Cu as the third metal.

The X-ray images at (c) (d) and (e) of FIG. 6 reveal precipitates in the Sn base. Dark gray parts of the X-ray image of Sn at (c) correspond to white parts of the X-ray image of Ag at (d), and are considered as showing an $Ag_3Sn$ compound. Light gray parts of the X-ray image of Sn at (c) correspond to light gray parts of the X-ray image of Cu at (e), and are considered as showing a $Cu_6Sn_5$ compound. Thus, two compounds, AgSn and CuSn, are found as the main precipitates in the base.

The X-ray image of Ni at (f) of FIG. 6 reveals the concentration of Ni around Cu particles, though it is not clear, and a compound surrounding Cu particles is a ternary compound of Sn, Cu and Ni in view of the X-ray images of Sn and Cu. The SnCuNi compound is considered as a relatively stable compound of little growth as compared with CuSn in view of the amount of Ni employed. The formation of the SnCuNi compound around Cu particles suggests that the CuSn compound in the base contains Ni.

According to the third invention, a two-stage dispersed structure is formed by fine dispersed precipitates of SnCuNi and SnAg in the base and particles of the third metal having a diameter of several tens of microns, and the ternary precipitate of Sn, Cu and Ni and the SnAg compound are thermally stable and give a stable structure, thereby forming a joint of high reliability.

According to the third invention, it is possible to employ the solder material which can be jointed at a temperature close to the joining temperature of 250° C. of a typical lead-free solder having an Sn3.5Ag eutectic composition as a base (having a melting point close to 220° C.), and when an Sn3.5Ag0.5Cu solder is, for example, used for the latter step of soldering a different part, the heat-resistant solder of the present invention used for a joint formed by the former step stays in a solid and liquid coexisting state on heating to 250° C. and is so viscous as to suppress any mutual displacement of the joint-forming materials to thereby enable the latter step to form a joint.

Fourth Invention

Description will now be made of a specific form of the fourth invention. Specific examples of the solder cream according to the fourth invention, the results of their evaluation, etc will be described later in the section of Examples.

The fourth invention is characterized by "comprising a mixture of a first powder alloy containing 10-30 wt % Ag and 2-20 wt % Cu with a balance consisting of Sn and unavoidable impurities, and a second powder alloy containing not more than 4.0 wt % Ag, not more than 2.0 wt % Cu and not more than 10 wt % In with a balance consisting of Sn and unavoidable impurities, the mixture containing a total of not more than 35 wt % of Ag and Cu", or "comprising a mixture of a first powder alloy containing 10-30 wt % Ag and 2-20 wt % Cu with a balance consisting of Sn and unavoidable impurities, and a second powder alloy containing not more than 4.0 wt % Ag, not more than 2.0 wt % Cu and not more than 10 wt % Bi with a balance consisting of Sn and unavoidable impurities, the mixture containing a total of not more than 35 wt % of Ag and Cu". The technical meanings of all the constituents except In or Bi in the second powder alloy have been stated in detail in the description of the first invention. The meanings of the constituents of the first powder alloy characterized mainly by containing more Ag and Cu than any standard solder alloy of the eutectic composition have also been stated it detail in the description of the first invention.

Explanation will now be made of the meaning of In or Bi added to the second powder alloy close to a eutectic composition.

While FIG. 2 relating to the first invention shows the sectional structures and metal distributions of a solder joint made without adding In or Bi, a strengthened Sn-based matrix is desirable for improving the heat resistance and reliability of the solder joint. A reduction in viscosity of the second powder alloy forming the matrix of a microstructure is desirable for improved bonding property. The SnAgCu composition is encountered by the coarsening of crystal grains and the aggregation of Ag in its microstructure, resulting in a reduction in strength of the Sn-based matrix, after a long time of use, depending on the temperature at which it is used. Therefore, In or Bi is added to the second powder alloy.

Figure 7:
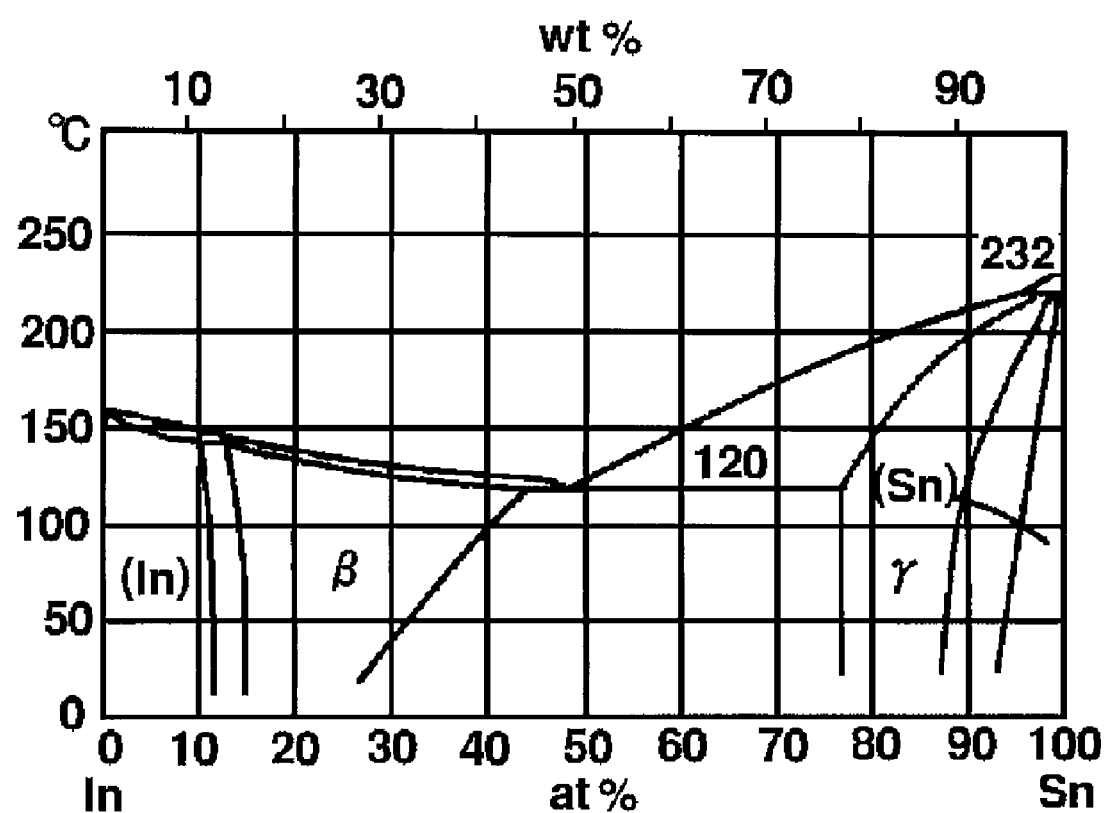
FIG. 7 is an Sn—In phase diagram explaining a specific form of a fourth invention.
Figure 8:
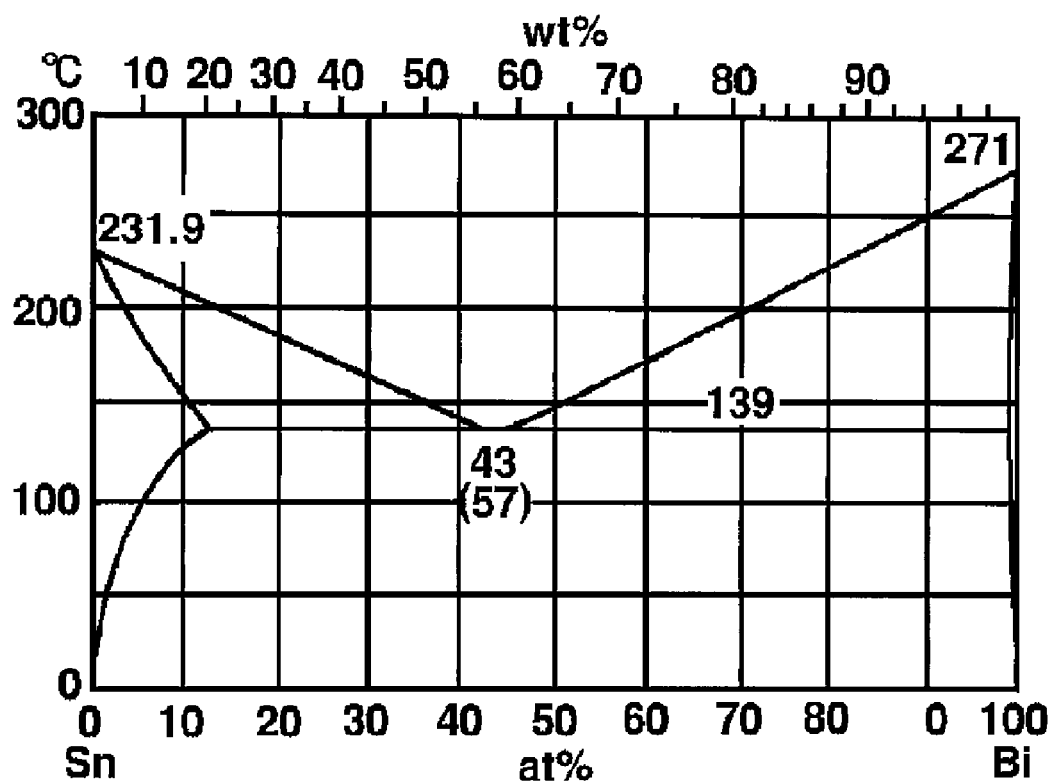
FIG. 8 is an Sn—Bi phase diagram explaining a specific form of the fourth invention.

FIG. 7 shows an Sn—In phase diagram. While In has a melting point of 160° C., the Sn—In phase diagram shows a eutectic composition (120° C.) with 50 wt % In and a eutectic reaction in the range of 44%≤In≤77% and when its amount is small, In forms a solid solution in Sn to form an SnIn precipitate. It suppresses the diffusion of a solid solution constituent, such as Ag, and thereby raises the stability of the structure of a solder joint and improves its heat resistance and reliability. The addition of In is also effective for achieving a lower liquidus temperature and a higher liquid-phase ratio at the time of forming a joint and thereby an improved bonding property by a reduction of viscosity.

FIG. 3 shows an Sn—Bi phase diagram. It shows a eutectic composition (139° C.) with 57 wt % Bi and a eutectic reaction with 21 wt % or more Bi and when its amount is small, Bi forms a solid solution in Sn to form an SnBi precipitate. It suppresses the diffusion of a solid solution constituent, such as Ag, and thereby raises the stability of the structure of a solder joint and improves its heat resistance and reliability. The addition of Bi is also effective for achieving a lower liquidus temperature and a higher liquid-phase ratio at the time of forming a joint and thereby an improved bonding property by a reduction of viscosity.

Examples of the Fourth Invention

Examples of the fourth invention and the results of its evaluation will now be described with a comparative example with reference to FIG. 9. FIG. 9 is a table showing the compositions of the alloys according to the Examples of the fourth invention and the Comparative Example and the results of measurements on the hardness of their Sn-based matrixes.

Description will first be made of the composition of the solder cream according to Comparative Example to which no In or Bi was added, and the steps for preparing it. A powder having a particle diameter of 20 to 45 μm (with a solidus of about 220° C. and a liquidus of about 350° C.) was prepared as a first powder alloy by melting at about 400° C. an Sn20Ag5Cu0.1Ni alloy made by melting at 530° C. An Sn3.5Ag0.5Cu0.07Ni0.01Ge powder (having a particle diameter of 20 to 45 μm and a melting point of about 220° C.) was prepared as a second powder alloy. The first and second powder alloys were mixed in a weight ratio of 3:1 and their mixture was mixed with a flux to prepare a solder cream. This solder cream is identical to what has been described as Example 1 of the first invention.

Description will now be made of the composition of the solder creams according to Examples 1 and 2 in FIG. 9 and the steps for preparing them. The first powder alloy for both Examples 1 and 2 was identical to what was employed in Comparative Example as described above. In Example 1, a powder obtained by adding 7.75 wt % In to the above Sn3.5Ag0.5Cu0.07Ni0.01Ge powder (having a particle diameter of 20 to 45 μm) was employed as the second powder alloy. The first and second powder alloys were mixed in a weight ratio of 3:1 and their mixture was mixed with a flux to prepare a solder cream. In Example 2, a powder obtained by adding 8.4 wt % to the above Sn3.5Ag0.5Cu0.07Ni0.01Ge powder (having a particle diameter of 20 to 45 μm) was employed as the second powder alloy. The first and second powder alloys were mixed in a weight ratio of 3:1 and their mixture was mixed with a flux to prepare a solder cream. The mixture of the first and second powder alloys according to Example 1 or 2 contained 2.1 wt % In, or Bi, respectively.

The addition of Ni is effective for improving heat resistance and bonding property and for forming fine particles by a precipitate of NiSn, and the addition of Ge is effective for inhibiting the oxidation of the main constituent Sn and improving bonding property and storage stability of the solder cream.

Description will now be made of the results of measurements of hardness of the Sn-based matrix of each of the solder joints according to Examples 1 and 2 and Comparative Example as described above. The hardness of the matrix was measured by the nano-indentation method. The measurements were made at eight points, and FIG. 9 shows the values as obtained at the eight points and the average thereof. The hardness was determined from an indentation pressure (GPa) based on a load-displacement curve obtained from an indentation test conducted by employing a triangular pyramid indenter and a weight of 0.5 mN. The larger the value, the higher the hardness of the matrix.

Example 1 or 2 in which In or Bi was added showed an improved hardness owing to the strengthened solid solution of In or Bi over the Comparative Example. Accordingly, the Examples of the invention can be said to have higher thermal fatigue strength and improved heat resistance and reliability. The addition of In or Bi is also effective for achieving an improved bonding property by a reduction of viscosity. The addition of In is preferably not more than 10 wt % in view of its coexistence with Sn during solidification and its cost. The addition of Bi is preferably not more than 10 wt % for avoiding any excessive hardness and any lowering in melting temperature of the eutectic composition by microsegregation.

INDUSTRIAL APPLICABILITY

The present invention can provide a high-temperature lead-free solder material which is based on an inexpensive Sn—Ag—Cu solder alloy having high strength and thermal stability and good bonding property, and is suitable for application to dual-temperature solder connection, and a method of soldering an electronic part.

A structure having not only CuSn and AgSn compounds, but also Cu particles dispersed in the Sn-based matrix can be obtained to produce a solder joint having an increased solid density and thereby strengthened as a whole.

The addition of Cu powder as the third powder enables a reduction in the amount of the first powder alloy which is relatively rich in Ag, and thereby an overall reduction in the cost of the solder.

The invention claimed is:

1. A solder cream for a dual-temperature solder connection, in which two steps of high and low temperature soldering are conducted in a reflow process, employing at least two kinds of solders having different reflow temperatures, the solder cream being obtained by kneading an Sn—Ag—Cu alloy with a flux, the Sn—Ag—Cu alloy comprising a mixture of a first powder alloy for a high melting point and a second powder alloy for a low melting point, the first powder alloy comprising, 10 to 30% by weight of Ag, and 2 to 20% by weight of Cu, with a balance consisting of Sn and unavoidable impurities; and the second powder alloy comprising smaller amounts, in percent by weight, of Ag and Cu than the first powder alloy, wherein the second powder alloy has a melting point lower than that of the first powder alloy, and wherein the Sn—Ag—Cu alloy mixture comprises a total amount of Ag and Cu of not more than 35% by weight, and the Sn—Ag—Cu alloy mixture after melting comprises a total amount of Ag of more than 10% by weight.

2. The solder cream according to claim 1, wherein the first powder alloy is present in an amount of not less than 50% by weight of the mixture of the first and second powder alloys.

3. The solder cream according to claim 1, wherein at least one of the first and second powder alloy comprises at least one of:

Ni, Fe, or Co, in an amount of not more than 1.0% by weight, or

Ge, in an amount of not more than 0.1% by weight.

4. The solder cream according to claim 1, wherein the second powder alloy comprises:

between 0 to 4.0% by weight of Ag, and between 0 to 2.0% by weight of Cu, with a balance consisting of Sn and unavoidable impurities.

5. The solder cream according to claim 4, wherein the first powder alloy is present in an amount of not less than 50% by weight of the mixture of the first and second powder alloys.

6. The solder cream according to claim 4, wherein at least one of the first and second powder alloy comprises at least one of:

Ni, Fe, or Co, in an amount of not more than 1.0% by weight, or

Ge, in an amount of not more than 0.1% by weight.

7. A solder cream for a dual-temperature solder connection, in which two steps of high and low temperature soldering are conducted in a reflow process, employing at least two kinds of solders having different reflow temperatures, the solder cream being obtained by kneading an Sn—Ag—Cu alloy with a flux, the Sn—Ag—Cu alloy comprising a mixture of a first powder alloy for a high melting point and a second powder alloy for a low melting point, the first powder alloy comprising, 10 to 30% by weight of Ag, and 2 to 20% by weight of Cu, with a balance consisting of Sn and unavoidable impurities; and the second powder alloy comprising, between 0 to 4.0% by weight of Ag, between 0 to 2.0% by weight of Cu, and one of:

between 0 to 8% by weight of Sb, between 0 to 10% by weight of In, and between 0 to 10% by weight of Bi, with a balance consisting of Sn and unavoidable impurities, wherein, the Sn—Ag—Cu alloy mixture comprises a total amount of Ag and Cu of not more than 35% by weight, and the Sn—Ag—Cu alloy mixture after melting comprises a total amount of Ag of more than 10% by weight.

8. A solder cream for a dual-temperature solder connection, in which two steps of high and low temperature soldering are conducted in a reflow process, employing at least two kinds of solders having different reflow temperatures, the solder cream being obtained by kneading an Sn—Ag—Cu alloy with a flux, the Sn—Ag—Cu alloy comprising an alloy mixture of a first powder alloy for a high melting point, a second powder alloy for a low melting point, and a third powder, the first powder alloy comprising, 10 to 30% by weight of Ag, and 2 to 20% by weight of Cu, with a balance consisting of Sn and unavoidable impurities; and the second powder alloy comprising, between 0 to 4.0% by weight of Ag, and between 0 to 4.0% by weight of Cu, with a balance consisting of Sn and unavoidable impurities; and the third powder comprising Cu, wherein the Sn—Ag—Cu alloy mixture comprises a total amount of Ag and Cu of not more than 35% by weight, the Cu is present in an amount of not more than 25% by weight of the total weight of the alloy mixture and the Cu powder, and the Sn—Ag—Cu alloy mixture after melting comprises a total amount of Ag of more than 10% by weight.

* * * * *